US012764923B2

(12) United States Patent
Gao et al.

(10) Patent No.: US 12,764,923 B2
(45) Date of Patent: Oct. 13, 2026

(54) MEMORY WITH THREE-DIMENSIONAL VERTICAL STRUCTURE AND METHOD OF MANUFACTURING MEMORY WITH THREE-DIMENSIONAL VERTICAL STRUCTURE

(71) Applicant: INSTITUTE OF MICROELECTRONICS, CHINESE ACADEMY OF SCIENCES, Beijing (CN)

(72) Inventors: Jianfeng Gao, Beijing (CN); Weibing Liu, Beijing (CN); Junjie Li, Beijing (CN); Na Zhou, Beijing (CN); Tao Yang, Beijing (CN); Junfeng Li, Beijing (CN); Jun Luo, Beijing (CN)

(73) Assignee: Institute Of Microelectronics, Chinese Academy of Sciences, Beijing (CN)

( * ) Notice: Subject to any disclaimer, the term of this patent is extended or adjusted under 35 U.S.C. 154(b) by 309 days.

(21) Appl. No.: 18/799,167

(22) Filed: Aug. 9, 2024

(65) Prior Publication Data

US 2025/0063713 A1 Feb. 20, 2025

(30) Foreign Application Priority Data

Aug. 14, 2023 (CN) ........................ 202311022435.1

(51) Int. Cl.
*H10B 12/00* (2023.01)

(52) U.S. Cl.
CPC .................................. *H10B 12/00* (2023.02)

(58) Field of Classification Search
CPC ...................................................... H10B 12/00
USPC ......................................................... 257/401
See application file for complete search history.

(56) References Cited

U.S. PATENT DOCUMENTS

2023/0380133 A1* 11/2023 Zhu ....................... H10B 12/00

* cited by examiner

*Primary Examiner* — Tong-Ho Kim
(74) *Attorney, Agent, or Firm* — Schwegman Lundberg & Woessner, P.A.

(57) ABSTRACT

The present disclosure provides a memory with a three-dimensional vertical structure and a manufacturing method. The memory includes: a semiconductor substrate, a first isolation layer, a first transistor and a second transistor. The first transistor includes a first source layer, a second isolation layer, a first drain layer, a third isolation layer, and a first through hole penetrating to the first source layer. A first active layer, a first gate dielectric layer and a first gate layer are on an inner sidewall of the first through hole. The second transistor includes a fourth isolation layer, a second source layer, a fifth isolation layer, and a second through hole penetrating to the first gate layer. A second active layer, a second gate dielectric layer and a second gate layer are on an inner sidewall of the second through hole. The second through hole is surrounded by the first through hole.

15 Claims, 6 Drawing Sheets

MEMORY WITH THREE-DIMENSIONAL VERTICAL STRUCTURE AND METHOD OF MANUFACTURING MEMORY WITH THREE-DIMENSIONAL VERTICAL STRUCTURE

CROSS REFERENCE TO RELATED APPLICATION

This application claims priority to Chinese Patent Application No. 202311022435.1, filed on Aug. 14, 2023, the entire content of which is incorporated herein in its entirety by reference.

TECHNICAL FIELD

The present disclosure relates to a field of semiconductor device, in particular to a memory with a three-dimensional vertical structure and a method of manufacturing a memory with a three-dimensional vertical structure.

BACKGROUND

A traditional DRAM (Dynamic Random Access Memory) cell is formed by one transistor and one capacitor. However, with the increase of integration, the capacitive structure continues to shrink, the charge storage capacity continues to decrease, the leakage is too fast, and DRAM is about to reach the refresh frequency limit. In recent years, a 2T0C (2 Transistor 0 Capacitor, dual-transistor capacitor-free) DRAM cell based on two oxide semiconductor IGZO thin film transistors has appeared. As shown in FIG. 1, a drain of one transistor is connected to a gate of the other transistor, and a gate capacitance is used to store charges and change transconductance storage information of the transistor. In recent years, the 2T0C memory using Indium Gallium Zinc Oxide (IGZO) as a channel is widely popular. This is because an off-state current of the IGZO Thin Film Transistor (TFT) is extremely small, and the 2T0C DRAM cell based on the IGZO TFT may significantly reduce the leakage speed. However, in the 2T0C DRAM cell based on the IGZO TFT in the related art, two TFTs with horizontal channels are connected on a same plane, which occupies a large area and has a low integration density.

SUMMARY

On a first aspect of the present disclosure, a memory with a three-dimensional vertical structure is provided, including a semiconductor substrate, a first isolation layer, a first transistor and a second transistor stacked in sequence from bottom to top;

where the first transistor includes a first source layer, a second isolation layer, a first drain layer and a third isolation layer stacked in sequence from bottom to top and a first through hole, where the first through hole penetrates the third isolation layer, the first drain layer and the second isolation layer in sequence and stops at the first source layer, and a first active layer, a first gate dielectric layer and a first gate layer are stacked in sequence on an inner sidewall of the first through hole;

where the second transistor includes a fourth isolation layer, a second source layer and a fifth isolation layer stacked in sequence from bottom to top and a second through hole, where the second through hole penetrates the fifth isolation layer, the second source layer and the fourth isolation layer in sequence and stops at the first gate layer, and a second active layer, a second gate dielectric layer and a second gate layer are stacked in sequence on an inner sidewall of the second through hole; and where a projection of the second through hole on the first isolation layer is surrounded by a projection of the first through hole on the first isolation layer.

Furthermore, a dielectric material is same as a material of the first gate dielectric layer.

Furthermore, the memory with the three-dimensional vertical structure further includes: a first contact plug electrically interconnected to the first source layer, a second contact plug electrically interconnected to the first drain layer, a third contact plug electrically interconnected to the second source layer, and a fourth contact plug electrically interconnected to the second gate layer.

Furthermore, the first contact plug, the second contact plug, the third contact plug and the fourth contact plug are distributed in a stepped shape.

Furthermore, the first active layer and the second active layer are made of indium gallium zinc oxide.

On a second aspect of the present disclosure, a method of manufacturing a memory with a three-dimensional vertical structure is provided, including:

providing the semiconductor substrate;

forming, on a surface of the semiconductor substrate, the first isolation layer, the first source layer, the second isolation layer, the first drain layer and the third isolation layer in sequence from bottom to top;

forming, by etching, the first through hole penetrating the third isolation layer, the first drain layer and the second isolation layer in sequence and stopping at the first source layer;

depositing the first active layer, the first gate dielectric layer and the first gate layer in sequence in the first through hole;

forming, above the first gate layer, the fourth isolation layer, the second source layer and the fifth isolation layer in sequence from bottom to top;

forming, by etching, the second through hole penetrating the fifth isolation layer, the second source layer and the fourth isolation layer in sequence and stopping at the first gate layer; and depositing the second active layer, the second gate dielectric layer and the second gate layer in sequence in the second through hole.

Furthermore, the method further includes: after forming the second gate layer, forming a sixth isolation layer above the second gate layer;

forming an isolation trench by etching; and filling the isolation trench with an insulation material, so as to form an array cell.

Furthermore, the method further includes:

respectively forming, after forming the array cell, a first contact hole penetrating to the first source layer, a second contact hole penetrating to the first drain layer, a third contact hole penetrating to the second source layer and a fourth contact hole penetrating to the second gate layer; and filling the first contact hole, the second contact hole, the third contact hole and the fourth contact hole with a conductive material, so as to form a first contact plug, a second contact plug, a third contact plug and a fourth contact plug, respectively.

Furthermore, the first active layer and the second active layer are made of indium gallium zinc oxide.

Furthermore, the method further includes: before forming a sixth isolation layer and after forming the second gate layer, performing a surface planarization process.

BRIEF DESCRIPTION OF THE DRAWINGS

Various other advantages and benefits will become clear to those ordinary skilled in the art by reading the following detailed description of preferred embodiments. The accompanying drawings are only for the purpose of illustrating the preferred embodiments and are not considered as a limitation of the present disclosure.

DETAILED DESCRIPTION OF EMBODIMENTS

Hereinafter, embodiments of the present disclosure will be described with reference to the accompanying drawings. However, it should be understood that these descriptions are just exemplary and not intended to limit the scope of the present disclosure. In addition, in the following explanations, descriptions of well-known structures and technologies are omitted to avoid unnecessary obscuring the concepts of the present disclosure.

Various structural diagrams according to the embodiments of the present disclosure are shown in the accompanying drawings. These diagrams are not drawn to scale, in which some details may be enlarged and some details may be omitted for clarity of presentation. Shapes of various regions and layers as well as relative sizes and positional relationships thereof shown in the diagrams are just exemplary. In practice, there may be deviations due to manufacturing tolerances or technical limitations. Moreover, those skilled in the art may additionally design regions/layers with different shapes, sizes and relative positions according to actual needs.

In the context of the present disclosure, when a layer/element is referred to as being located "on" a further layer/element, the layer/element may be located directly on the further layer/element, or there may be an intermediate layer/element between them. In addition, if a layer/element is located "on" a further layer/element in an orientation, the layer/element may be located "below" the further layer/element when the orientation is reversed.

In the 2T0C DRAM cell in the related art, two TFTs with horizontal channels are connected on a same plane, which occupies a large area and is not conducive to improving the integration density.

A main purpose of the present disclosure is to provide a memory with a three-dimensional vertical structure and a method of manufacturing a memory with a three-dimensional vertical structure. In this structure, an upper transistor vertically overlaps with a lower transistor, which saves the cell area, improves the integration density and reduces the manufacturing costs.

Figure 2:
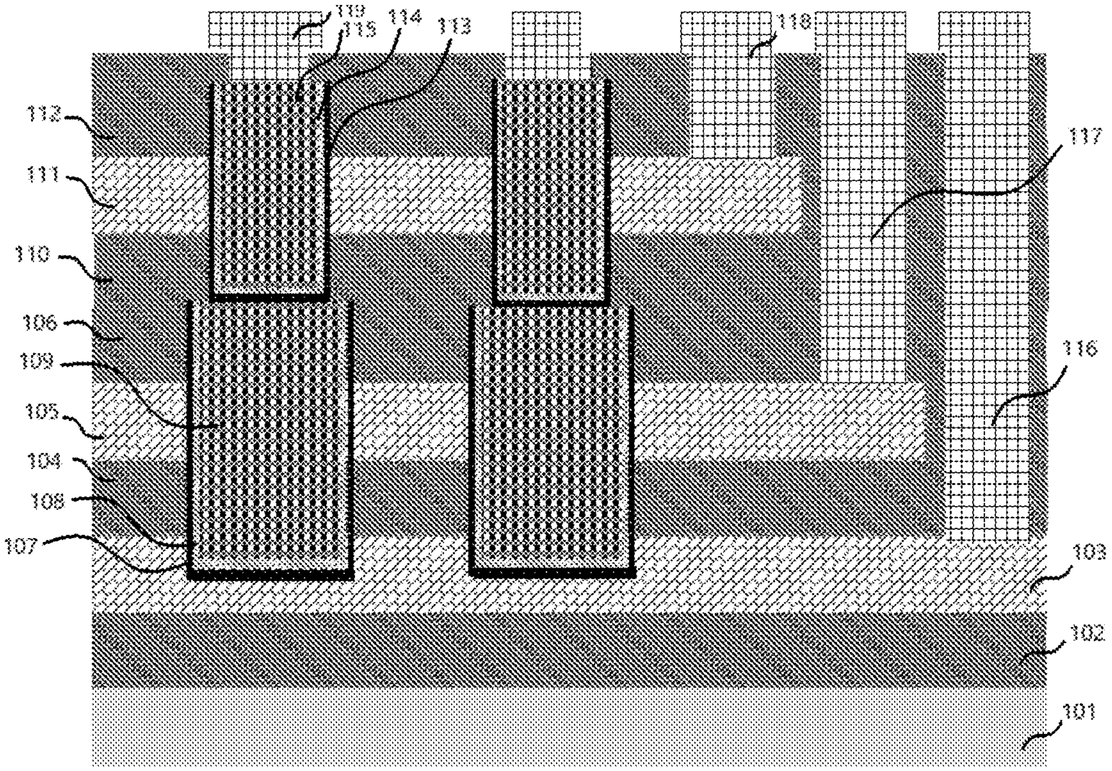
FIG. 2 is a schematic diagram of a memory with a three-dimensional vertical structure provided by the present disclosure.

The present disclosure provides a capacitor-free DRAM cell structure based on a thin film transistor, as shown in FIG. 2. In terms of functions, the structure may be divided into three main regions from bottom to top: a substrate, a first transistor and a second transistor, as described below.

A substrate 101 may be any substrate known to those skilled in the art for carrying elements of a semiconductor integrated circuit, such as silicon-on-insulator (SOI), bulk silicon, silicon carbide, germanium, silicon germanium, gallium arsenide, or germanium-on-insulator. A corresponding top layer semiconductor material is silicon, germanium, silicon germanium, or gallium arsenide.

An isolation layer 102 is formed on the substrate 101. The isolation layer 102 may be made of a material with high k dielectric such as oxide, oxynitride, etc., for example, typical silicon oxide ($SiO_2$), silicon oxynitride, silicon nitride ($SiN_x$), and the like.

Taking the isolation layer 102 as a boundary, a first transistor is located above the isolation layer 102. The first transistor is vertically stacked and achieves a function of a reading transistor. The first transistor includes a first source layer 103, a second isolation layer 104, a first drain layer 105 and a third isolation layer 106 stacked in sequence from bottom to top and a first through hole. The first through hole penetrates the third isolation layer 106, the first drain layer 105 and the second isolation layer 104 in sequence and stops at the first source layer 103. A first active layer 107, a first gate dielectric layer 108 and a first gate layer 109 are stacked in sequence on an inner sidewall of the first through hole.

The structure of the first through hole determines that each of the first active layer 107 and the first gate dielectric layer 108 is in a ring shape, and a cavity surrounded by the first active layer 107 and the first gate dielectric layer 108 is filled with the first gate layer 109. The first gate layer 109 in the first transistor is also a drain of the second transistor above the first transistor, that is, the first transistor and the second transistor share one electrode.

The second transistor is vertically stacked and achieves a writing function. The second transistor includes a fourth isolation layer 110, a second source layer 111, and a fifth isolation layer stacked in sequence from bottom to top and a second through hole. The second through hole penetrates the fifth isolation layer, the second source layer 111 and the fourth isolation layer 110 in sequence and stops at the first gate layer 109. A second active layer 113, a second gate dielectric layer 114 and a second gate layer 115 are stacked in sequence on an inner sidewall of the second through hole. The structure of the second through hole determines that each of the second active layer 113 and the second gate dielectric layer 114 is in a ring shape, and a cavity surrounded by the second active layer 113 and the second gate dielectric layer 114 is filled with the second gate layer 115.

It may be seen that each of the first transistor and the second transistor is in a vertical stack form, and a bit line, a word line, a gate and a channel in each transistor are vertically stacked and surrounded connected. The above plurality of three-dimensional stacks greatly reduce the cell area and increase the integration density.

Compared with other vertically stacked 2T0C DRAMs, the memory structure shown in FIG. 2 further has an advantage of smaller parasitic capacitance. The reason is that the gates of the first transistor and the second transistor are only metal electrodes in the through holes, especially storage nodes. The gate of the first transistor is used in situ as the drain of the second transistor, which greatly reduces the parasitic capacitance with other electrodes of the transistors.

Furthermore, in order to prevent an electrical interconnection between the active layer of the first transistor and the active layer of the second transistor as well as reduce a difficulty of the manufacturing process, the first through hole and the second through hole are designed with different sizes. Specifically, a projection of the second through hole on the first isolation layer is surrounded by a projection of the first through hole on the first isolation layer. This size differentiation design may adapt to more processes and methods. For example, a planarization process may be performed after forming the first gate layer, in this case, the planarization process may stop at the third isolation layer 106 or at the first gate dielectric layer 108. However, since a film thickness of each of the gate dielectric and the gate is small, and an etching selectivity ratio is not significantly large, it is difficult to control the etching stopping. If the structure of the present disclosure is adopted, it is not required to deliberately control an etching stopping point. In the present disclosure, "surrounded by" does not include a case where the projection of the second through hole on the first isolation layer overlap with the projection of the first through hole on the first isolation layer. In the present disclosure, an area of the projection of the first through hole on the first isolation layer is large, while an area of the projection of the second through hole on the first isolation layer is small. That is, an outer contour of the projection of the second through hole is entirely located inside an outer contour of the projection of the first through hole.

A dielectric material with a large area may be deposited above the second transistor, which plays a role of filling and isolating. At the same time, in order to lead out each electrode, the memory with the three-dimensional vertical structure further includes a first contact plug 116 electrically interconnected to the first source layer 103, a second contact plug 117 electrically interconnected to the first drain layer 105, a third contact plug 118 electrically interconnected to the second source layer 111, and a fourth contact plug 119 electrically interconnected to the second gate layer 115. These contact plugs may be distributed in a stepped shape, so as to reduce the short circuit effect and reduce the difficulty of implementing the process.

Figure 1:
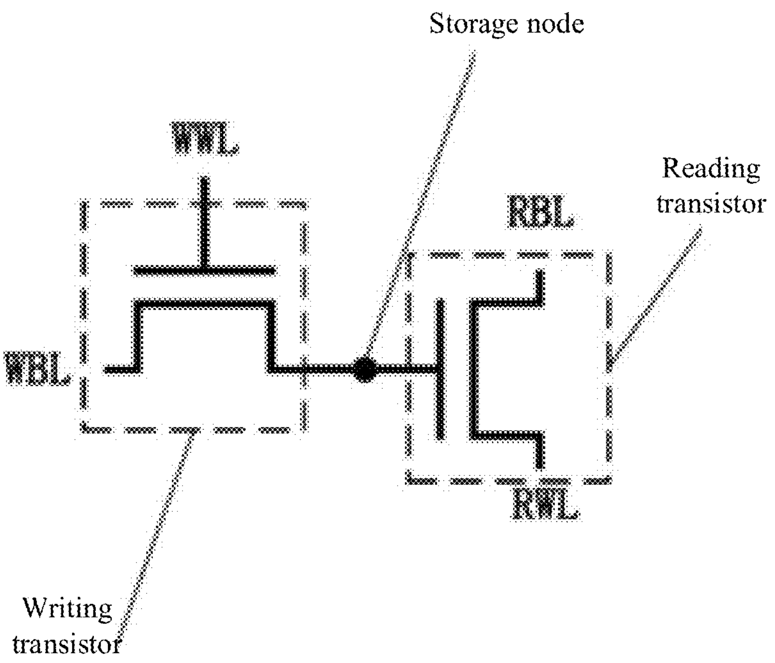
FIG. 1 is an operation circuit diagram of a dual-transistor capacitor-free DRAM cell.
Figure 3:
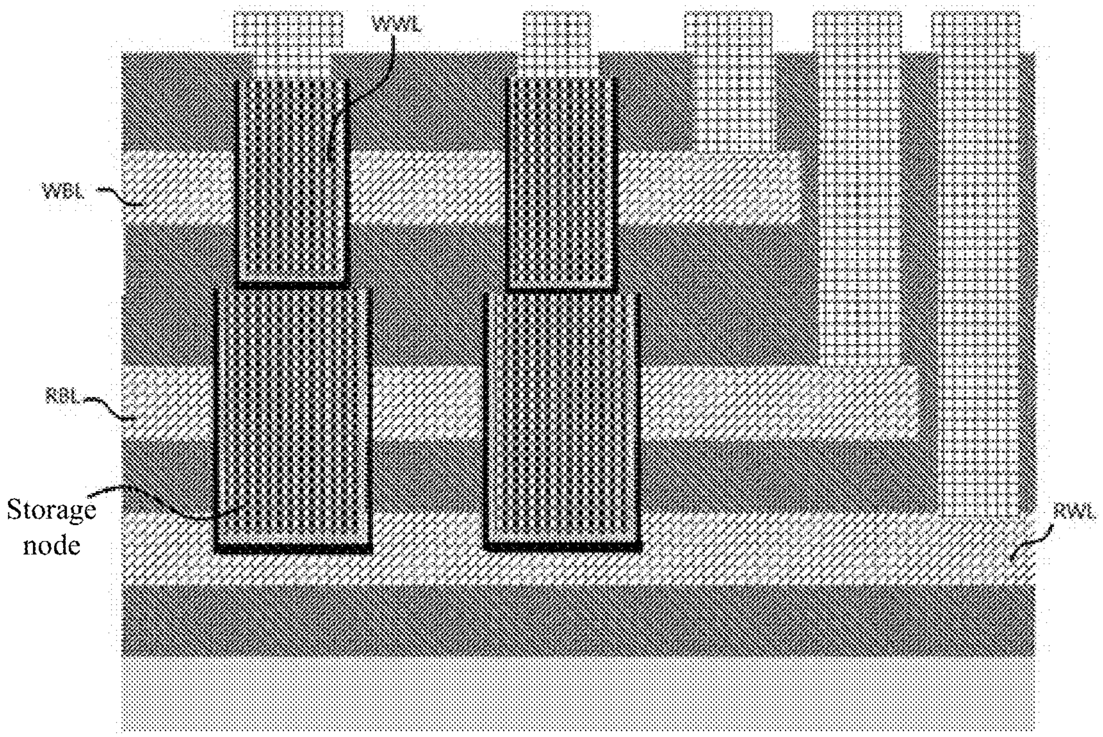
FIG. 3 is a schematic diagram of a function of each structure during operation of the structure shown in FIG. 2.

An operation circuit of the capacitor-free memory structure described in the present disclosure is shown in FIG. 1 (the position of the transistor in the figure is only for the convenience of illustrating an operation principle and does not represent an actual position layout) and FIG. 3 (indicating the function of each electrode). The first transistor is used as a reading transistor, and the second transistor is used as a writing transistor. The gate of the first transistor and the drain of the second transistor are the same electrode. Charges in a gate capacitance of the reading transistor is changed through the writing transistor, so as to affect a resistance state between the source and drain of the reading transistor, thereby achieving a distinction between "0" and "1". The specific principle is as follows.

During a process of writing "1", a positive voltage (greater than a threshold voltage Vth) is applied to a writing word line WWL, so that the writing transistor is turned on. A positive voltage is applied to a source (i.e. a writing bit line WBL) of the writing transistor to inject charges into the gate capacitance (i.e. the storage node) of the reading transistor. After injecting the charges, a gate voltage and a source voltage of the writing transistor are removed, and a "1" state is saved.

During a process of reading "1", a reading voltage is applied to a drain of the reading transistor. Since certain charges are stored in the gate capacitance, the reading transistor is in a lower resistance state, obtaining a larger current. After being amplified and recognized by a peripheral circuit, the process of reading "1" is completed.

During a process of writing "0", a positive voltage (greater than the threshold voltage Vth) is applied to the gate (i.e. the writing word line WWL) of the reading transistor, so that the writing transistor is turned on. A negative voltage is applied to the source (i.e. the writing bit line WBL) of the writing transistor to extract charges from the gate capacitance (i.e. the storage node) of the reading transistor. After extracting the charges, the gate voltage and the source voltage of the writing transistor are removed, and a "0" state is saved.

During a process of reading "0", a reading voltage is applied to the drain (RBL) of the reading transistor. Since there is no charge in the gate capacitance, the reading transistor is in a higher resistance state, obtaining a smaller current. After being amplified and recognized by the peripheral circuit, the process of reading "0" is completed.

In terms of selecting materials for the above memory structure, each layer may be made of any material that achieves a corresponding basic function. However, in order to further improve the electrical performance and usage effectiveness of the memory, each layer has a preferred material.

For example, the first active layer 107 and the second active layer 113 are used as channels. Each of the first active layer 107 and the second active layer 113 may be independently made of at least one of $In_2O_3$, ZnO, or IGZO (indium gallium zinc oxide). Since an off-state leakage of the IGZO thin film transistor is very low, information of the storage node may be maintained for a long time.

Each of the first gate dielectric layer 108 and the second gate dielectric layer 114 plays a role of insulating between the gate and the channel. Preferably, a material with a wide bandgap and a high dielectric constant, or a material suitable for manufacturing devices with extremely small sizes, such as at least one of $SiO_2$, $HfO_2$, or $Al_2O_3$, may be selected for each of the first gate dielectric layer 108 and the second gate dielectric layer 114.

The first source layer 103, the first drain layer 105, the first gate layer 109, the second source layer 111 and the second gate layer 115 are used as electrodes to be connected to the power supply. Preferably, each of the first source layer 103, the first drain layer 105, the first gate layer 109, the second source layer 111 and the second gate layer 115 may be made of a metal material or a doped semiconductor material with good conductivity, including but not limited to at least one of Mo, TiN, Ti, Al, W, indium tin oxide or indium zinc oxide. In addition, considering the fast and stable current transmission between the electrodes, the first source layer 103, the first drain layer 105, the first gate layer 109, the second source layer 111 and the second gate layer 115 are preferably made of the same material or materials with similar properties.

Each of the first isolation layer 102, the second isolation layer 104, the third isolation layer 106, the fourth isolation layer 110 and the fifth isolation layer may be made of a material with high k dielectric such as oxide, oxynitride, etc., for example, typical silicon oxide ($SiO_2$), silicon oxynitride, silicon nitride ($SiN_x$), and the like.

Therefore, in the present disclosure, a gate of the first transistor and a drain of the second transistor are a same electrode, that is, the first transistor and the second transistor share one electrode, achieving an integration method of dual-transistor capacitor-free. Moreover, the first transistor and the second transistor are stacked vertically, which saves a larger cell area and has a higher integration density compared with the planar stack.

In addition, the first through hole is larger than the second through hole, that is, the projection of the second through hole is surrounded by the projection of the first through hole. Therefore, with the formation of the fourth isolation layer, the second active layer on the sidewall is inevitably insulated and isolated from the first active layer, without the requirements for additional insulation material deposition or control of etching stopping position, thereby reducing the process difficulty.

The present disclosure further provides a method of manufacturing the above-mentioned memory, which has a simple process and good compatibility with related 3D semiconductor device manufacturing processes. In combination with FIG. 4 to FIG. 13 and FIG. 2, the specific process is as follows.

Figure 4:
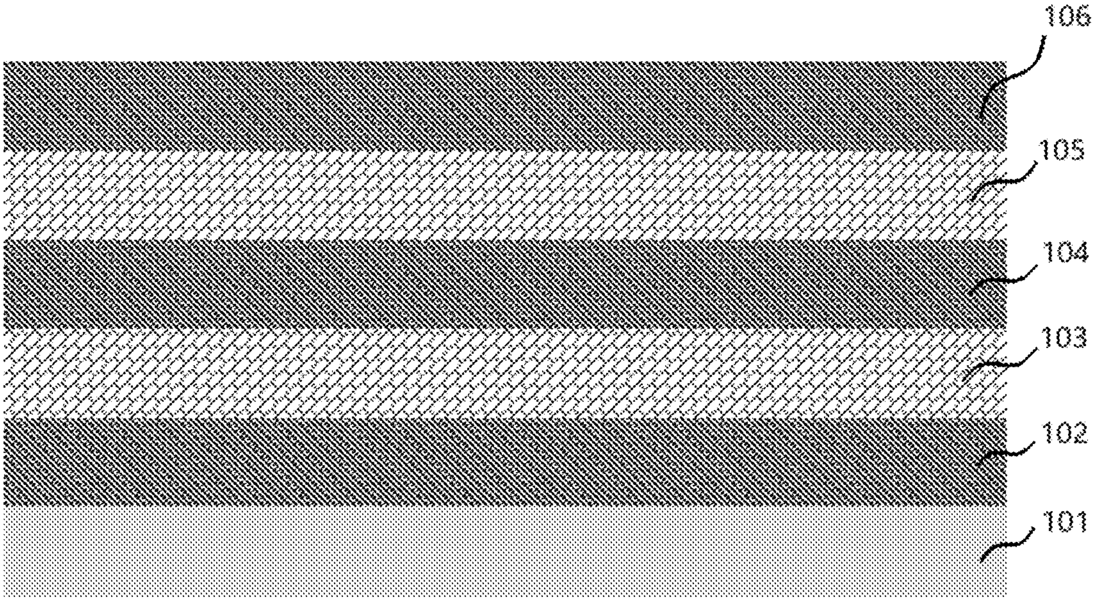
FIG. 4 to FIG. 12 are schematic diagrams of structures obtained in each step of a process of manufacturing a memory with a three-dimensional vertical structure provided by the present disclosure, as detailed in specific embodiments.

Firstly, a first isolation layer 102, a first source layer 103, a second isolation layer 104, a first drain layer 105 and a third isolation layer 106 are formed on a surface of a semiconductor substrate 101, as shown in FIG. 4. The first isolation layer 102, the first source layer 103, the second isolation layer 104, the first drain layer 105 and the third isolation layer 106 are stacked from bottom to top, all of which are deposited with a large area, and may be deposited using deposition methods such as physical vapor deposition (PVD), PECVD chemical vapor deposition (CVD), and ALCVD atomic layer deposition.

Figure 5:
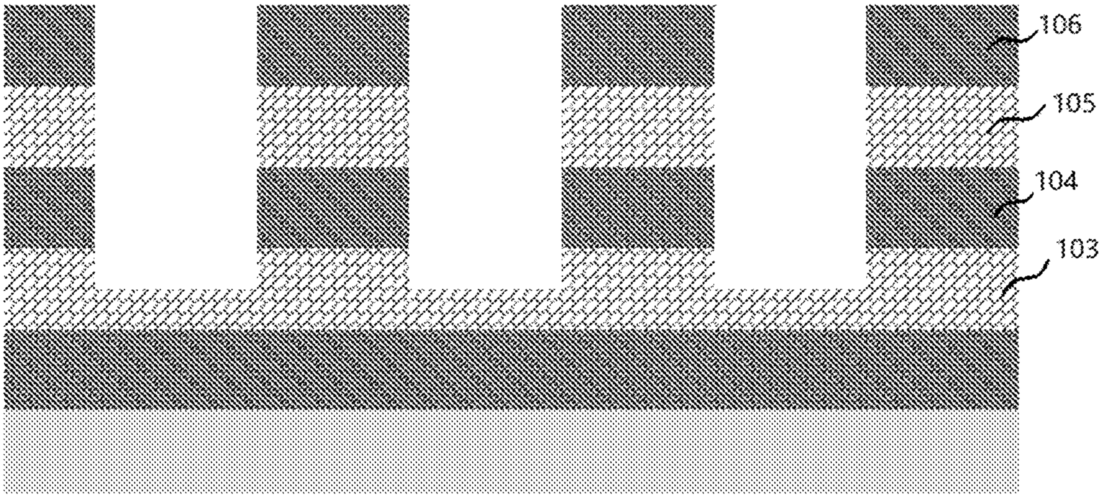

Next, a first through hole structure is formed by patterning and etching, so as to expose the first source layer 103. A sidewall of the through hole may be maintained to be vertical, as shown in FIG. 5.

Figure 6:
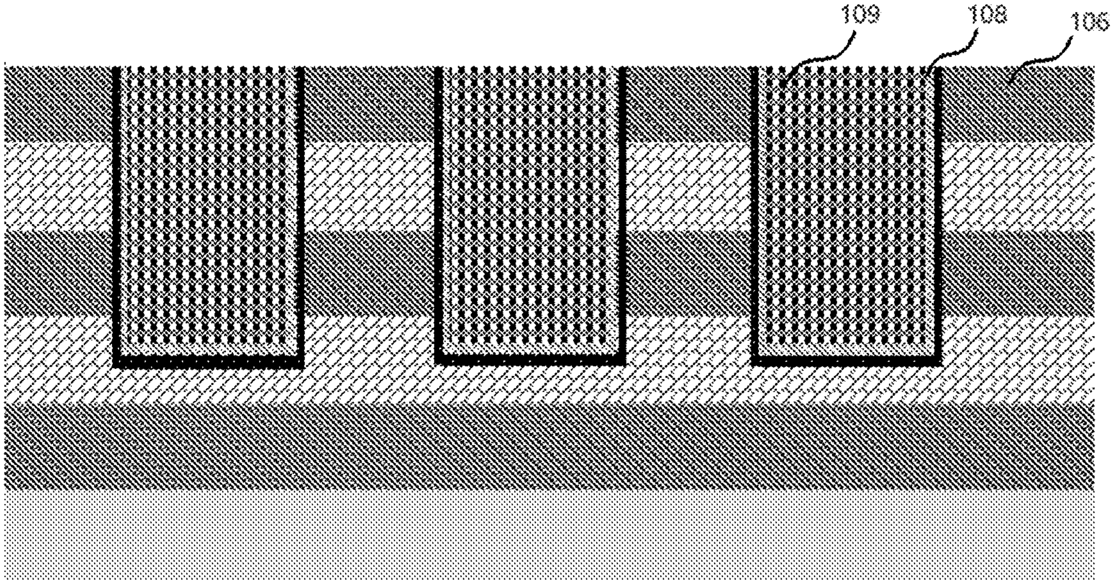

Afterwards, a first active layer 107 is deposited in the first through hole, as shown in FIG. 6.

A first gate dielectric layer 108 and a first gate layer are deposited in sequence. Planarization is performed on the first through hole structure and stopped at the third isolation layer 106.

Figure 7:
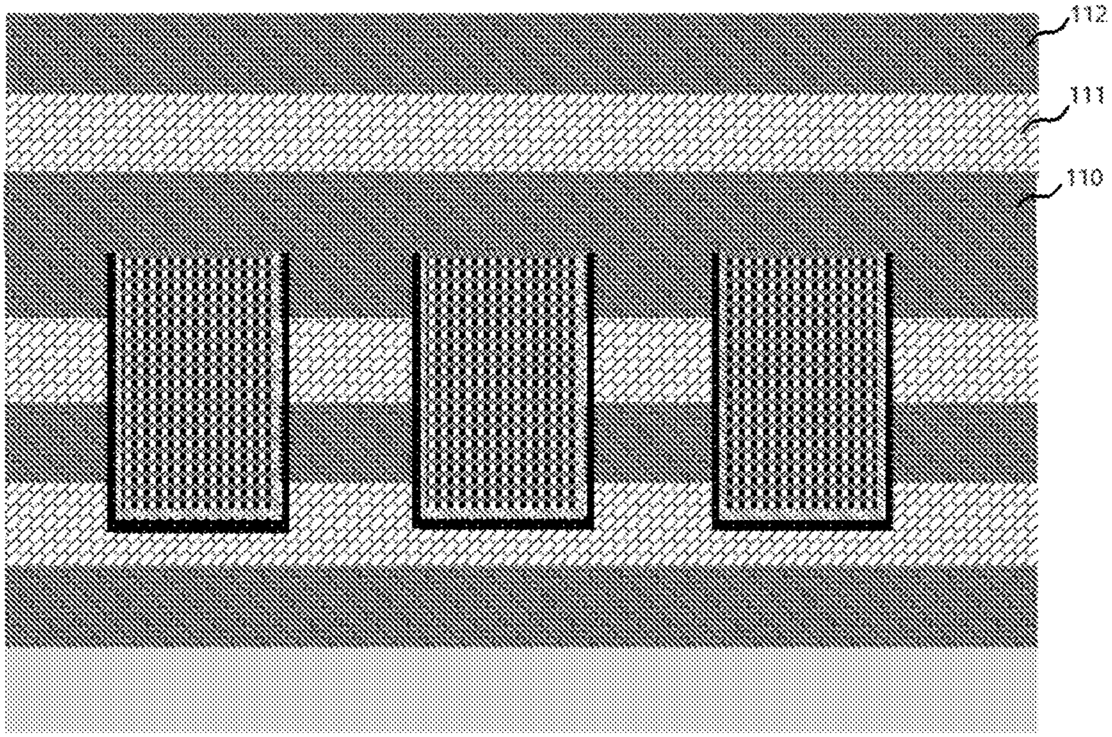

Next, a fourth isolation layer 110, a second source layer 111 and a fifth isolation layer are deposited, as shown in FIG. 7.

Figure 8:
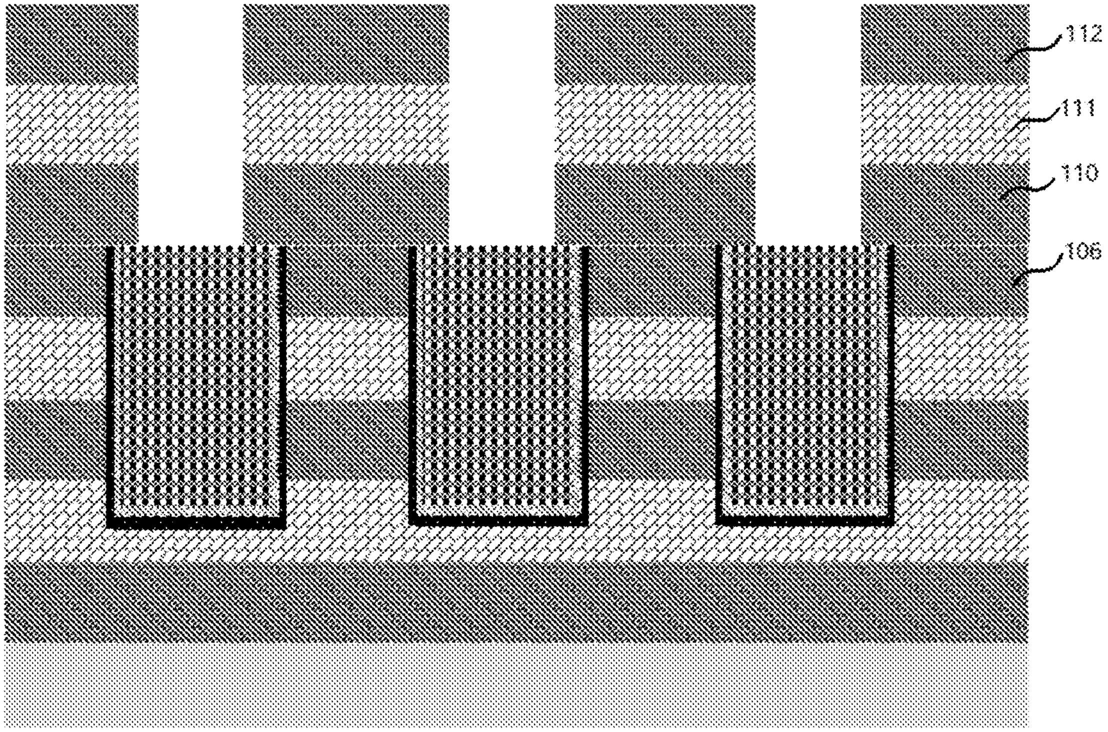

A second through hole structure is formed by patterning and etching, so as to expose the first gate layer 109, as shown in FIG. 8. A size of the second through hole is smaller than a size of the first through hole, and an outer contour of the first through hole surrounds an outer contour of the second through hole. In this way, a contact between the first active layer 107 on the sidewall and the second active layer to be deposited subsequently may be avoided.

Figure 9:
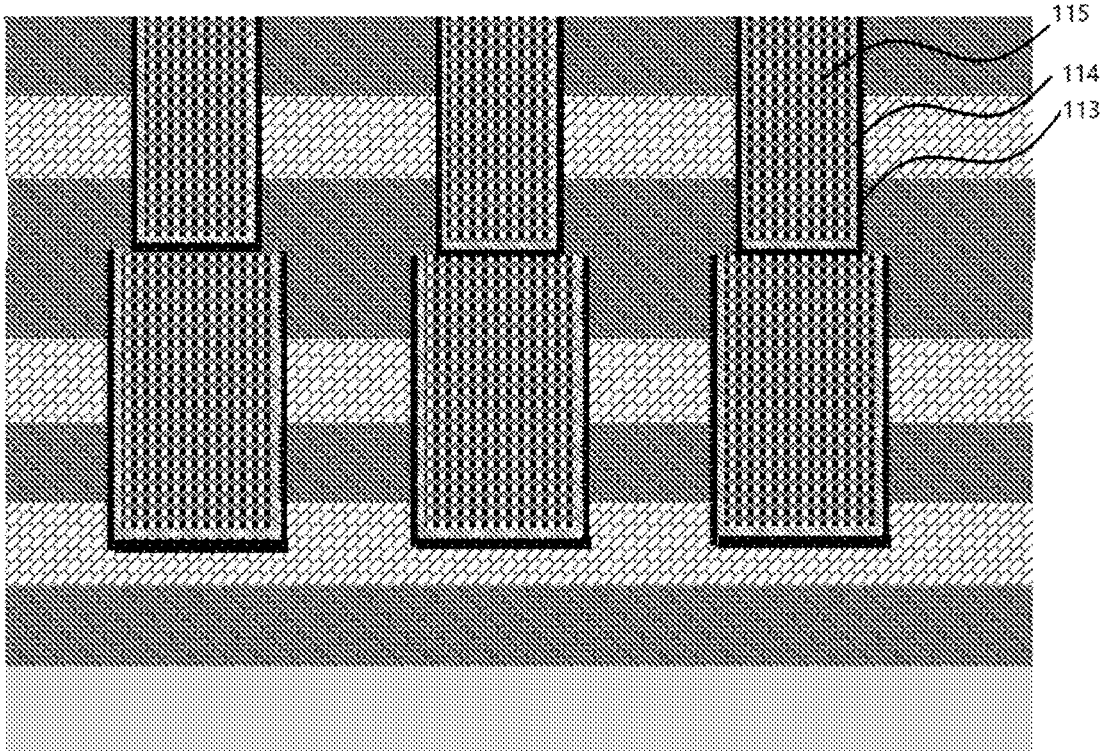

A second active layer 113, a second gate dielectric layer 114, and a second gate layer 115 are deposited in sequence, and planarization is performed on the second through hole, as shown in FIG. 9.

Figure 10:
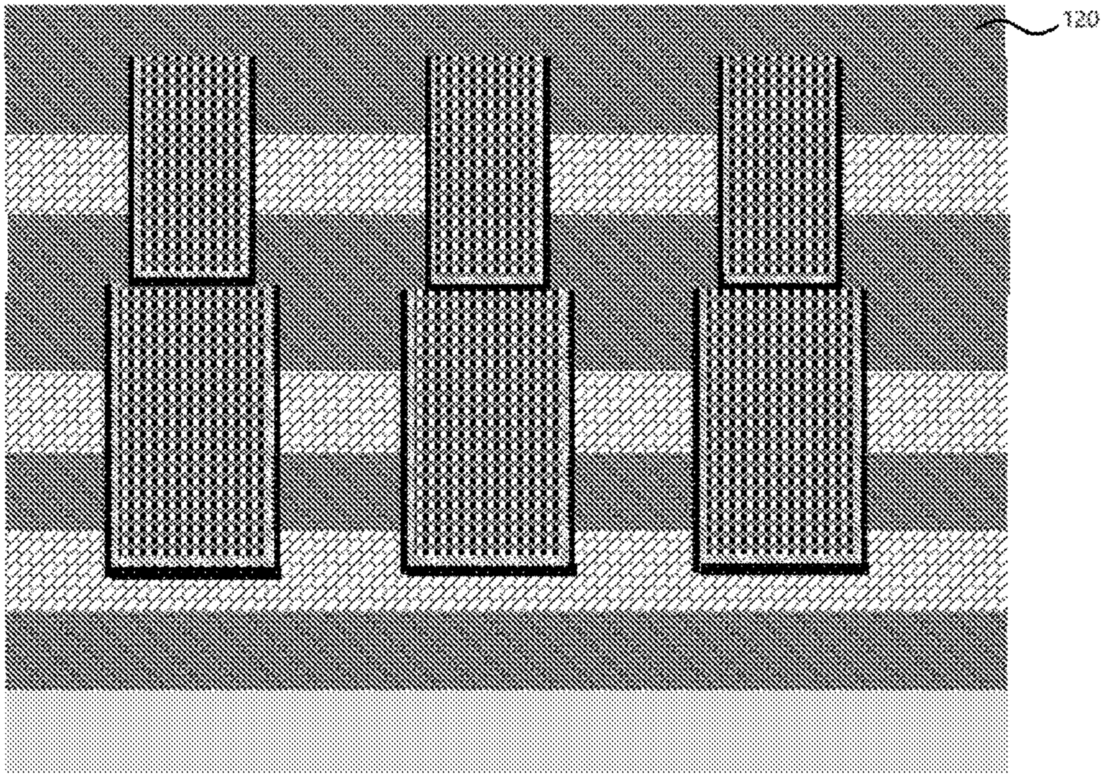

Afterwards, a sixth isolation layer 120 is deposited, as shown in FIG. 10. The sixth isolation layer 120 may be made of a material with high k dielectric such as oxide, oxynitride, etc., for example, typical silicon oxide ($SiO_2$), silicon oxynitride, silicon nitride ($SiN_x$), and the like.

Figure 11:
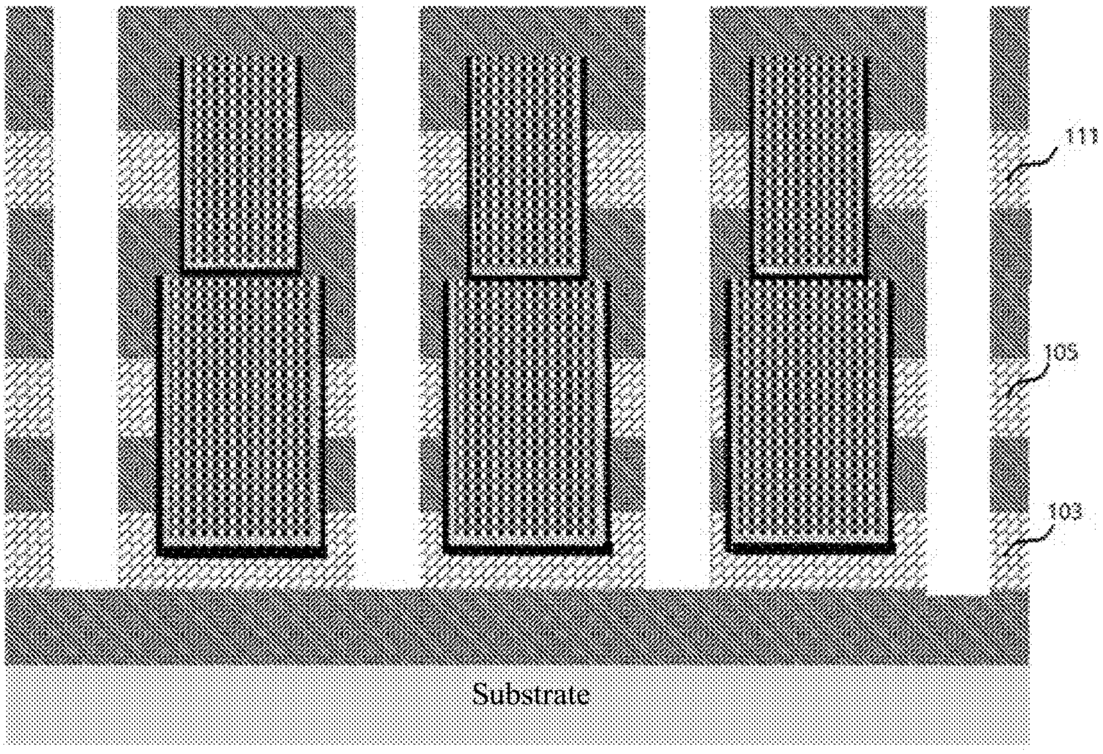

A trench structure is formed through a patterning process, so as to isolate source/drain layers and divide the memory structure into array cells, as shown in FIG. 11.

Figure 12:
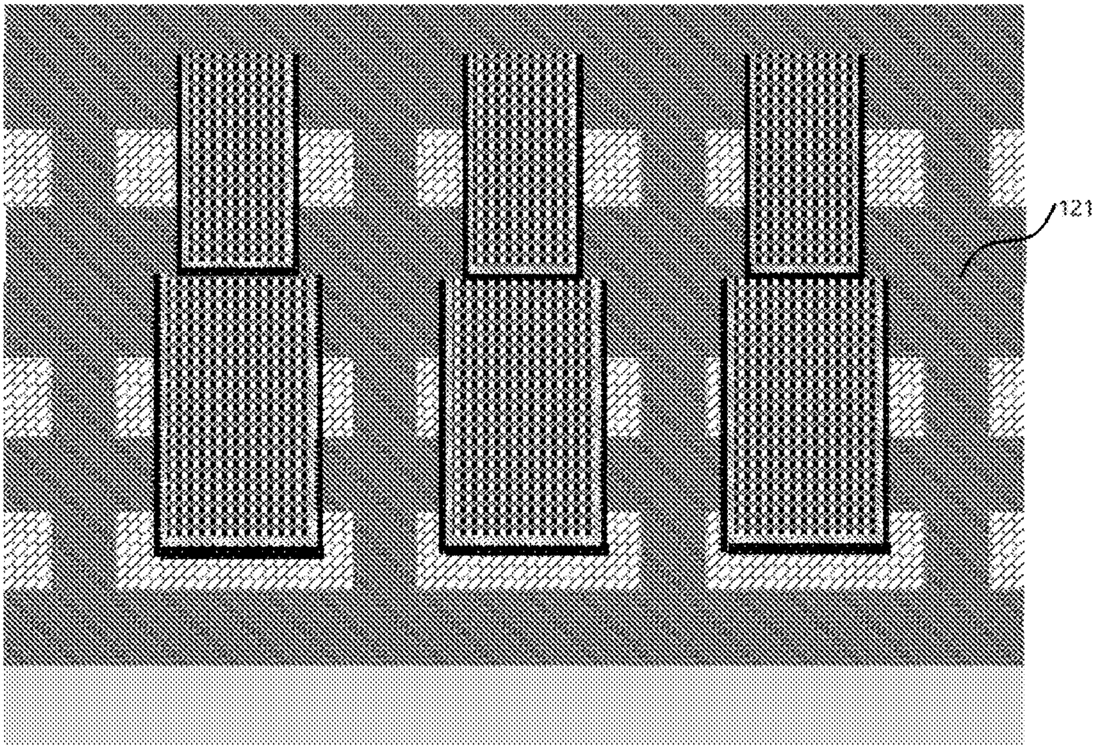

The isolation trench is filled with a dielectric to form an isolation structure 121, and a planarization process is performed, as shown in FIG. 12.

Finally, contact holes connected to respective electrodes, including a first contact hole penetrating to the first source layer 103, a second contact hole penetrating to the first drain layer 105, a third contact hole penetrating to the second source layer 111 and a fourth contact hole penetrating to the second gate layer 115, are formed through an etching process. The above contact holes are distributed in a stepped shape, as shown in FIG. 2.

Each contact hole described above is filled with a conductive material to form a first contact plug 116, a second contact plug 117, a third contact plug 118 and a fourth contact plug 119, so as to complete the interconnection process, as shown in FIG. 2.

Therefore, in the present disclosure, by using a difference between a size of the first through hole and a size of the second through hole, the upper and lower transistors with the same size share one electrode and the interconnection between the active layers of the upper and lower transistors is avoided. The active layer of the upper transistor is isolated from the active layer of the lower transistor by the fourth isolation layer.

Compared with the related art, the present disclosure achieves the following technical effects:

In the memory structure of the present disclosure, the upper transistor vertically overlaps with the lower transistor, which saves the cell area, improves the integration density and reduces the manufacturing costs. Furthermore, the process difficulty is reduced by using the difference between the size of the through hole in the upper transistor and the size of the through hole in the lower transistor.

The embodiments of the present disclosure are described above. However, these embodiments are for illustrative purposes only and are not intended to limit the scope of the present disclosure. The scope of the present disclosure is defined by the attached claims and their equivalents. Without departing from the scope of the present disclosure, those skilled in the art may make various substitutions and modifications, which should all fall within the scope of the present disclosure.

What is claimed is:

1. A memory with a three-dimensional vertical structure, comprising: a semiconductor substrate, a first isolation layer, a first transistor and a second transistor stacked in sequence from bottom to top;

wherein the first transistor comprises a first source layer, a second isolation layer, a first drain layer and a third isolation layer stacked in sequence from bottom to top and a first through hole, wherein the first through hole penetrates the third isolation layer, the first drain layer and the second isolation layer in sequence and stops at the first source layer, and a first active layer, a first gate dielectric layer and a first gate layer are stacked in sequence on an inner sidewall of the first through hole;

wherein the second transistor comprises a fourth isolation layer, a second source layer and a fifth isolation layer stacked in sequence from bottom to top and a second through hole, wherein the second through hole penetrates the fifth isolation layer, the second source layer and the fourth isolation layer in sequence and stops at the first gate layer, and a second active layer, a second gate dielectric layer and a second gate layer are stacked in sequence on an inner sidewall of the second through hole; and wherein a projection of the second through hole on the first isolation layer is surrounded by a projection of the first through hole on the first isolation layer.

2. The memory with the three-dimensional vertical structure of claim 1, wherein a dielectric material is same as a material of the first gate dielectric layer.

3. The memory with the three-dimensional vertical structure of claim 2, wherein the first active layer and the second active layer are made of indium gallium zinc oxide.

4. The memory with the three-dimensional vertical structure of claim 1, further comprising:

a first contact plug electrically interconnected to the first source layer, a second contact plug electrically interconnected to the first drain layer, a third contact plug electrically interconnected to the second source layer, and a fourth contact plug electrically interconnected to the second gate layer.

5. The memory with the three-dimensional vertical structure of claim 4, wherein the first active layer and the second active layer are made of indium gallium zinc oxide.

6. The memory with the three-dimensional vertical structure of claim 4, wherein the first contact plug, the second contact plug, the third contact plug and the fourth contact plug are distributed in a stepped shape.

7. The memory with the three-dimensional vertical structure of claim 6, wherein the first active layer and the second active layer are made of indium gallium zinc oxide.

8. The memory with the three-dimensional vertical structure of claim 1, wherein the first active layer and the second active layer are made of indium gallium zinc oxide.

9. A method of manufacturing the memory with the three-dimensional vertical structure of claim 1, comprising:

providing the semiconductor substrate;

forming, on a surface of the semiconductor substrate, the first isolation layer, the first source layer, the second isolation layer, the first drain layer and the third isolation layer in sequence from bottom to top;

forming, by etching, the first through hole penetrating the third isolation layer, the first drain layer and the second isolation layer in sequence and stopping at the first source layer;

depositing the first active layer, the first gate dielectric layer and the first gate layer in sequence in the first through hole;

forming, above the first gate layer, the fourth isolation layer, the second source layer and the fifth isolation layer in sequence from bottom to top;

forming, by etching, the second through hole penetrating the fifth isolation layer, the second source layer and the fourth isolation layer in sequence and stopping at the first gate layer; and depositing the second active layer, the second gate dielectric layer and the second gate layer in sequence in the second through hole.

10. The method of claim 9, further comprising: after forming the second gate layer, forming a sixth isolation layer above the second gate layer;

forming an isolation trench by etching; and filling the isolation trench with an insulation material, so as to form an array cell.

11. The method of claim 10, further comprising:

respectively forming, after forming the array cell, a first contact hole penetrating to the first source layer, a second contact hole penetrating to the first drain layer, a third contact hole penetrating to the second source layer and a fourth contact hole penetrating to the second gate layer; and filling the first contact hole, the second contact hole, the third contact hole and the fourth contact hole with a conductive material, so as to form a first contact plug, a second contact plug, a third contact plug and a fourth contact plug, respectively.

12. The method of claim 11, wherein the first active layer and the second active layer are made of indium gallium zinc oxide.

13. The method of claim 10, wherein the first active layer and the second active layer are made of indium gallium zinc oxide.

14. The method of claim 9, wherein the first active layer and the second active layer are made of indium gallium zinc oxide.

15. The method of claim 14, further comprising: before forming a sixth isolation layer and after forming the second gate layer, performing a surface planarization process.

* * * * *